United States Patent
Jacob

(10) Patent No.: US 9,455,199 B1
(45) Date of Patent: Sep. 27, 2016

(54) METHODS OF FORMING STRAINED AND RELAXED GERMANIUM FINS FOR PMOS AND NMOS FINFET DEVICES, RESPECTIVELY

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/044,219

(22) Filed: Feb. 16, 2016

(51) Int. Cl.
*H01L 21/8238* (2006.01)
*H01L 29/10* (2006.01)

(52) U.S. Cl.
CPC ........... *H01L 21/823807* (2013.01); *H01L 21/823821* (2013.01); *H01L 29/1054* (2013.01)

(58) Field of Classification Search
CPC ............ H01L 21/823807; H01L 21/823821; H01L 29/1054
USPC ........................................................ 438/229
See application file for complete search history.

(56) References Cited

U.S. PATENT DOCUMENTS

| 2015/0318176 A1* | 11/2015 | Qi ..................... H01L 21/26513 438/283 |
| 2016/0027779 A1* | 1/2016 | Loo ........................ H01L 29/165 257/190 |
| 2016/0027780 A1* | 1/2016 | Mitard ................ H01L 21/0245 257/190 |
| 2016/0027876 A1* | 1/2016 | Lee ..................... H01L 29/1054 257/369 |

OTHER PUBLICATIONS

Paul, "Silicon—Germanium Strained Layer Materials in Microelectronics," Advanced Materials, 11:191-204, 1999.

\* cited by examiner

*Primary Examiner* — Bradley K Smith
(74) *Attorney, Agent, or Firm* — Amerson Law Firm, PLLC

(57) ABSTRACT

One illustrative method disclosed herein includes, among other things, forming a first fin for the PMOS device and a second fin for the NMOS device, wherein each of the first and second fins comprises a lower substrate fin portion and an upper fin portion that is made of semiconductor material that is different from that of the substrate, performing at least one process operation to form a first channel semiconductor material for the PMOS FinFET device that comprises a fully-strained, substantially defect-free substantially pure germanium material on a recessed upper surface of the upper fin portion of the first fin and form a second channel semiconductor material for the NMOS FinFET device that comprises a fully-relaxed substantially pure germanium material that is substantially defect free positioned above an upper surface of the lower substrate fin portion of the second fin.

19 Claims, 12 Drawing Sheets

METHODS OF FORMING STRAINED AND RELAXED GERMANIUM FINS FOR PMOS AND NMOS FINFET DEVICES, RESPECTIVELY

BACKGROUND OF THE INVENTION

1. Field of the Invention

Generally, the present disclosure relates to the manufacture of FET semiconductor devices, and, more specifically, to various methods of forming strained and relaxed germanium fins for PMOS and NMOS FinFET devices, respectively.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

A conventional FET is a planar device. To improve the operating speed of planar FETs, and to increase the density of planar FETs on an integrated circuit product, device designers have greatly reduced the physical size of planar FETs over the past decades. More specifically, the channel length of planar FETs has been significantly decreased, which has resulted in improving the switching speed and in lowering operation currents and voltages of planar FETs. However, decreasing the channel length of a planar FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the planar FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of trenches 13, three illustrative fins 14, a gate structure 16, a sidewall spacer 18 and a gate cap layer 20. An isolation material 17 provides electrical isolation between the fins 14. The gate structure 16 is typically comprised of a layer of insulating material (not separately shown), e.g., a layer of high-k insulating material, and one or more conductive material layers that serve as the gate electrode for the device 10. The fins 14 have a three-dimensional configuration: a height H, a width W and an axial length L. The axial length L corresponds to the direction of current travel in the device 10 when it is operational. The portions of the fins 14 covered by the gate structure 16 are the channel regions of the FinFET device 10. The portions of the fins 14 that are positioned outside of the spacers 18 will become part of the source/drain regions of the device 10.

In the FinFET device 10, the gate structure 16 encloses both sides and the upper surface of the fins 14 to form a tri-gate structure so as to use a channel having a three-dimensional structure instead of a planar structure. In some cases, an insulating cap layer, e.g., silicon nitride, is positioned at the top of the fins 14 and the FinFET device only has a dual-gate structure (sidewalls only). Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects. When an appropriate voltage is applied to the gate electrode 16 of a FinFET device 10, the surfaces (and the inner portion near the surface) of the fins 14, i.e., the vertically oriented sidewalls and the top upper surface of the fin, form a surface inversion layer or a volume inversion layer that contributes to current conduction. Accordingly, for a given plot space (or footprint), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. Device designers are currently investigating alternative semiconductor materials, such as SiGe, Ge and III-V materials, to manufacture FinFET devices, which are intended to enhance the performance capabilities of such devices, e.g., to enable low-voltage operation without degrading their operating speed.

FIG. 1B is a perspective view of an illustrative prior art FinFET semiconductor device 10, wherein the overall fin structure of the device includes a substrate fin portion 14A and an alternative fin material portion 14B. As with the case above, the substrate fin portion 14A may be made of silicon, i.e., the same material as the substrate, and the alternative fin material portion 14B may be made of a material other than the substrate material, for example, silicon-germanium, substantially pure germanium, III-V materials, etc. As noted above, the use of such alternative fin materials improves the mobility of charge carriers in the device.

However, the integration of such alternative materials on silicon substrates (the dominant substrates used in the industry) is non-trivial due to, among other issues, the large difference in lattice constants between such alternative materials and silicon. That is, with reference to FIG. 1B, the lattice constant of the alternative fin material portion 14B of the fin 14 may be substantially greater than the lattice constant of the substrate fin portion 14A of the fin 14. As a result of this mismatch in lattice constants, an unacceptable number of defects may be formed or created in the alternative fin material portion 14B. As used herein, a "defect" essentially refers to a misfit dislocation at the interface between the portions 14A and 14B of the fin 14 or threading dislocations that propagate through the portion 14B on the fin 14 at well-defined angles.

With respect to forming such lattice-constant-mismatched materials on one another, there is a concept that is generally referred to as the "critical thickness" of a material. The term "critical thickness" generally refers to materials that are in one of three conditions, i.e., so-called "stable," "metastable" or "relaxed-with-defects" conditions. These three conditions also generally reflect the state of the strain on the material. That is, a stable material is in a fully-strained condition that is 100% strained in at least one crystalline plane of the material, a relaxed-with-defects material is a material that has zero strain in all crystalline planes, and a metastable material is strained to a level that is above zero strain but less than 100% strained in at least one crystalline plane of the metastable material. In general, a fully-strained (stable) material or a partially-strained (metastable) material will have fewer defects than a fully relaxed, unstrained material.

FIG. 1C is a graph taken from an article entitled "Silicon-Germanium Strained Layer Materials in Microelectronics" by Douglas J. Paul that was published in *Advanced Materials* magazine (11(3), 101-204 (1999)). FIG. 1C graphically depicts these three conditions for silicon germanium materials ($Si_{1-x}Ge_x$; x=0-1). The vertical axis is the critical thickness in nanometers. The horizontal axis is the concentration of germanium in the silicon germanium material. At the leftmost point on the horizontal axis is pure silicon (Ge concentration equals 0.0). At the rightmost point on the horizontal axis is pure germanium (Ge concentration equals 1.0). The two curves R and S define the stable, metastable and relaxed-with-defects regions for silicon germanium materials having differing germanium concentration levels. Above and to the right of curve R are materials that are in a relaxed condition with defects present in the material. Below and to the left of the curve S are materials that are in the stable or fully strained condition where there are little or no defects present in the material. The region between the two curves R and S defines the region where materials are in the metastable condition. The graph reflects the critical thickness of various materials when they are grown in an unconfined growth environment, e.g., when growing a substantially planar alternative semiconductor film or layer on the entire upper surface of a silicon substrate.

To add more precision to the terminology regarding critical thickness, the term "stable critical thickness" will be used herein and in the attached claims to refer to a maximum thickness of a material at which it may be formed in a substantially defect-free and "fully-strained" condition above a substrate material in an unconfined growth environment. Additionally, as used herein and in the attached claims, the term "metastable critical thickness" will be used to refer to a maximum thickness of a material at which it may be formed in a metastable condition above a substrate material, i.e., in an unconfined growth environment. As noted above, a material that is in the metastable condition is a material that has experienced some degree of strain-relaxation, but still remains strained to some degree (i.e., 1-99% strained but not 100% strained) in one crystalline plane of the metastable material such that defects are not typically formed in the metastable material itself. However, a metastable material may or may not have some amount of defects at the interface between the alternative material and a silicon substrate, depending upon the amount of strain relaxation that has happened to the material.

With reference to FIG. 1C, a layer of pure germanium (Ge concentration equal to 1.0) may be in the stable and fully strained condition at a thickness up to about 1-2 nm (point CT1) and it may be in a metastable condition for thicknesses between about 2-4 nm (point CT2). Above a thickness of about 4 nm, a layer of pure germanium will be in the relaxed-with-defects condition. In contrast, a layer of silicon germanium with a 50% concentration of germanium may be in the stable and fully strained condition at thicknesses up to about 4 nm (point CT3) and it may be in a metastable condition for thicknesses between about 4-30 nm (point CT4). Above a thickness of about 30 nm, a layer of silicon germanium with a 50% concentration of germanium will be in the relaxed-with-defects condition. A material that is in the relaxed-with-defects condition is a material that contains visible defects that are indicative that the material has relaxed to the point where defects have been formed in the material.

As another example, a substantially pure layer of germanium (Ge concentration equal to 1.0) may have a maximum stable critical thickness of about 1-2 nm when formed on a silicon substrate, i.e., in an unconfined growth environment. A substantially pure layer of germanium formed to a thickness of 1-2 nm or less would be considered to be a stable, fully-strained layer of germanium. In contrast, a layer of silicon germanium with a concentration of germanium of about fifty percent ($SiGe_{0.5}$) may have a maximum stable critical thickness of about 4 nm and still be substantially free of defects, i.e., in a stable condition. However, such a layer of germanium or silicon germanium would no longer be considered to be a stable material if grown beyond their respective maximum stable critical thickness values. When such a layer of material is grown to a thickness that is greater than its maximum stable critical thickness but less than its maximum metastable thickness, it is considered to be a metastable material that would start experiencing some degree of relaxation, i.e., there will be some degree of strain relaxation along one or more of the crystalline planes of the material and there may or may not be some defects present at or near the interface between the alternative fin material and the substrate fin. Thus, in general, the formation of stable, fully-strained, substantially defect-free alternative materials on silicon is limited to very thin layers of the alternative materials.

One of the proposed approaches for the formation of alternative materials for FinFET devices will now be discussed with reference to FIGS. 1D-1H, which are cross-sectional views of the fins taken in a gate width direction of the device 10. As shown in FIG. 1D, the initial fin structures 14 are formed in the substrate 12 by performing an etching process through a patterned etch mask 15. FIG. 1E depicts the device 10 after the layer of insulating material 17 was deposited in the trenches 13 and one or more CMP processes were performed to remove the etch mask 15 and excess amounts of the layer of insulating material 17. These operations expose the upper surface of the fins 14. Next, as shown in FIG. 1F, a timed recessing etching process was performed to remove a portion of the initial fins 14 (now denoted as fins 14A) such that they have a recessed upper surface 14R.

Thereafter, as shown in FIG. 1G, the alternative fin material 14B is grown on the recessed fin structures by performing a selective epitaxial deposition process. FIG. 1H depicts the device after a recess etching process was performed on the layer of insulating material 17 such that it has a recessed upper surface 17R that exposes the desired amount of the alternative fin material 14B. At the point of processing depicted in FIG. 1H, traditional manufacturing processes are then performed to form the gate structure 16, gate cap layer 20 and sidewall spacers 18.

Another prior art technique for forming fins made of alternative semiconductor materials involves the formation of one or more so-called SRB (strained relaxed buffer) layers on the silicon substrate (prior to fin-formation) or on the recessed silicon fins prior to formation of the channel semiconductor material, such as a material containing a high concentration of germanium or substantially pure germanium. For example, a germanium channel material formed on an SRB layer having a relatively low percentage of germanium, e.g., 25% or less, can provide substantial band offset isolation for PMOS devices. However, band offset isolation is not possible for an NMOS device using the same SRB layer due to the different nature and composition of an NMOS device and a PMOS device. This is problematic for many integrated circuit products that are manufactured using CMOS technology, i.e., using both NMOS and PMOS devices. The formation of separate SRB layers for NMOS and PMOS devices would increase processing complexity and costs.

It is well known that the presence of defects in an alternative-material fin structure would be detrimental to device operations. One process that has been investigated for use in forming such alternative fin materials is known as aspect-ratio-trapping (ART). In general, the ART process involves forming a masking layer, such as silicon dioxide, above a semiconductor substrate, such as silicon, patterning the masking layer to define a trench that exposes the underlying substrate, and performing an epitaxial growth process to form an alternative fin material, e.g., silicon germanium, on the exposed substrate, wherein the growth is confined within the trench. That is, the ART process involves epitaxially growing fully relaxed, unstrained material hetero-structures in a high aspect-ratio trench (having an aspect ratio of 5 or greater) defined in a layer of insulating material in an effort to intentionally create defects in the lower portions of the alternative fin material while trying to decrease the number of defects present in the upper portion of the alternative fin material which will ultimately serve as the channel regions for the completed device. In some applications, the ART process may involve the formation of trenches that have a very high aspect ratio, e.g., about 25-30. Importantly, in the ART process, the trench is made deep enough such that defects that are intentionally generated in the lower portion of the alternative fin material will be trapped at or near the bottom of the original trench and in the sidewalls of the trench, i.e., the intentionally created defects will be trapped or positioned in an area slightly above the interface between the substrate material and the alternative fin material. The amount of defects generated and the propagation of such defects will depend upon the crystal orientation of the substrate. The intent of the ART process is that, while the defect-containing fin material is present at or near the bottom of the trench, the upper-most portions of the epitaxially grown alternative fin material will be substantially defect-free material but, importantly, it is an un-strained material. That is, the un-strained alternative fin material is fully relaxed in all crystalline planes, e.g., in the crystalline planes that correspond to the axial length direction, height direction and width direction of the fin. This occurs due to the "trapping" of the intentionally created defects at or near the bottom of the trench, with the result being the formation of substantially defect-free alternative fin material above the defective-containing portions of the alternative fin material in the lower portion of the trench. The ART process reduces the thickness of the material requirement for non-defective growth in comparison to the blanket growth of a similar structure. However, in the ART growth process, there are intentionally-formed defects present in the bottom portion of the alternative fin material as well as defects at the interface of the hetero-structure, and the grown material is typically relatively thick, e.g., about 200-300 nm, which corresponds to the fin height direction. The intentionally created defects are typically generated along the 111 crystallographic direction of the alternative fin material and they are captured or stopped by the sidewalls of the trench.

The present disclosure is directed to various methods of forming strained and relaxed germanium fins for PMOS and NMOS FinFET devices, respectively, in CMOS integrated circuit products that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming strained and relaxed germanium fins for PMOS and NMOS FinFET devices, respectively, for a CMOS integrated circuit product. One illustrative method disclosed herein includes, among other things, forming a first fin for the PMOS device and a second fin for the NMOS device, wherein each of the first and second fins comprises a lower substrate fin portion and an upper fin portion that is made of semiconductor material that is different from that of the substrate, and forming a layer of insulating material adjacent the first and second fins. In this embodiment, the method also includes performing at least one process operation to form a first channel semiconductor material for the PMOS FinFET device that comprises a fully-strained, substantially defect-free substantially pure germanium material on a recessed upper surface of the upper fin portion of the first fin, forming a second channel semiconductor material for the NMOS FinFET device that comprises a fully-relaxed substantially pure germanium material that is substantially defect-free material positioned above an upper surface of the lower substrate fin portion of the second fin, and forming gate structures around the first and second channel semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1A:
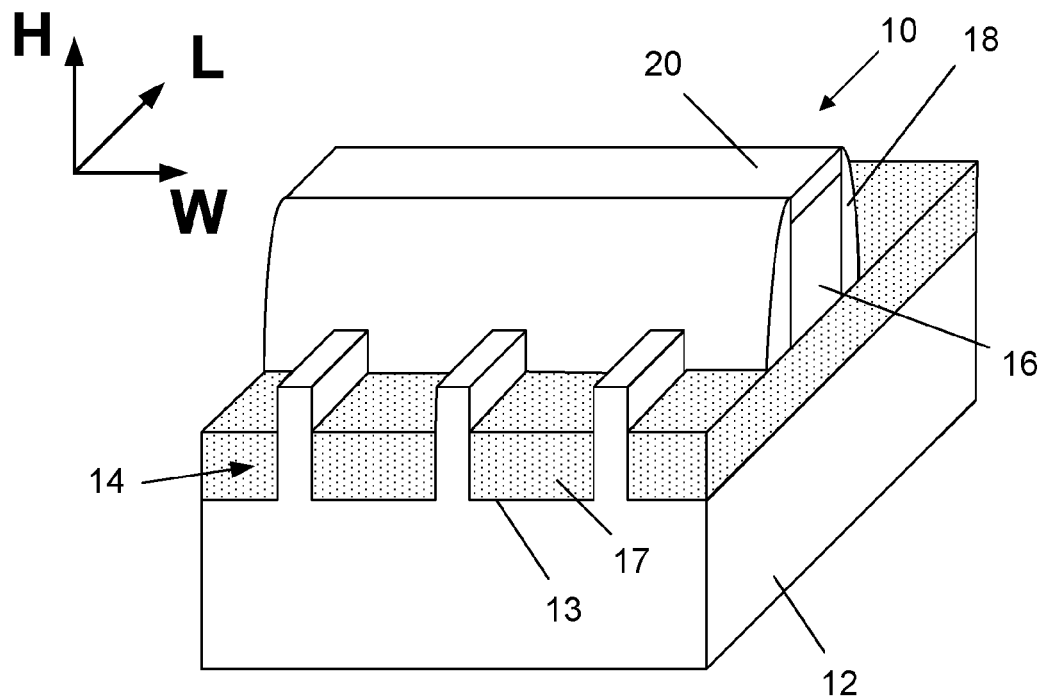
FIG. 1A depicts an example of prior art FinFET devices wherein the fins for the device are comprised of the substrate material.
Figure 1B:
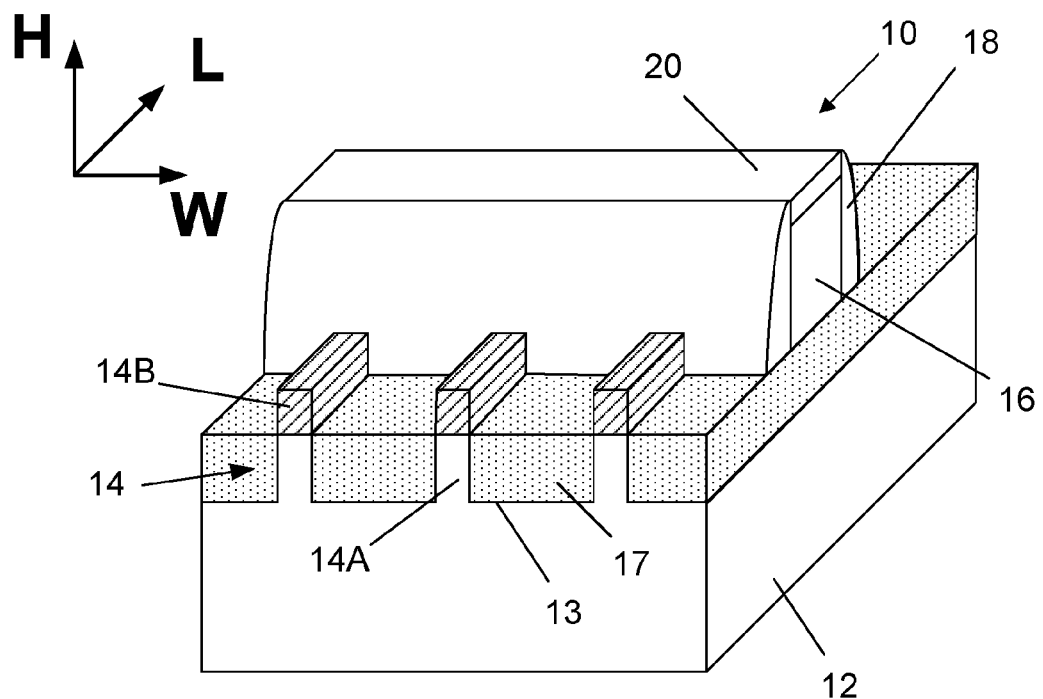
FIG. 1B depicts an example of prior art FinFET devices wherein the fins for the device are comprised of an alternative fin material formed above a substrate fin.
Figure 1C:
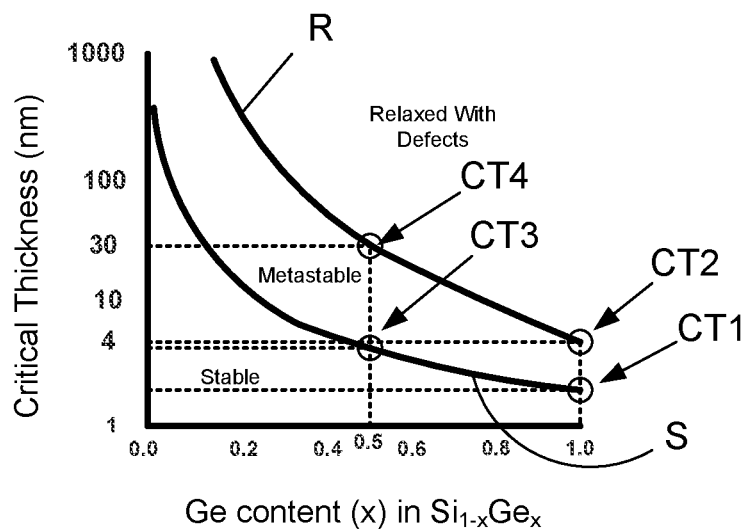
FIG. 1C is an illustrative example of a graph that depicts the condition of alternative materials when formed in an unconfined growth environment.
Figure 1D:
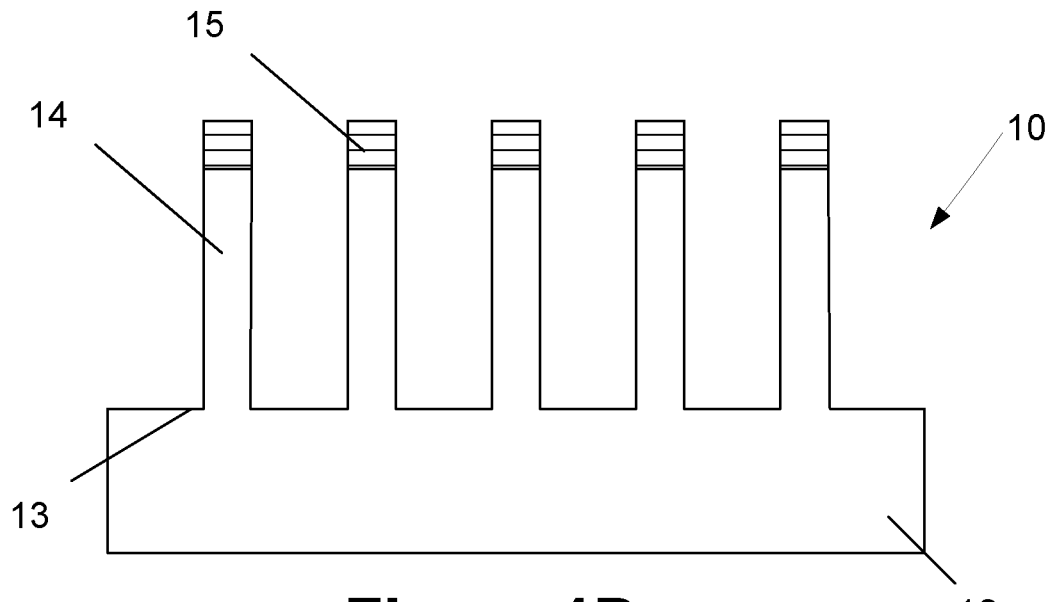
FIGS. 1D-1H depict one illustrative prior art process flow for forming alternative fin materials on FinFET devices.
Figure 1E:
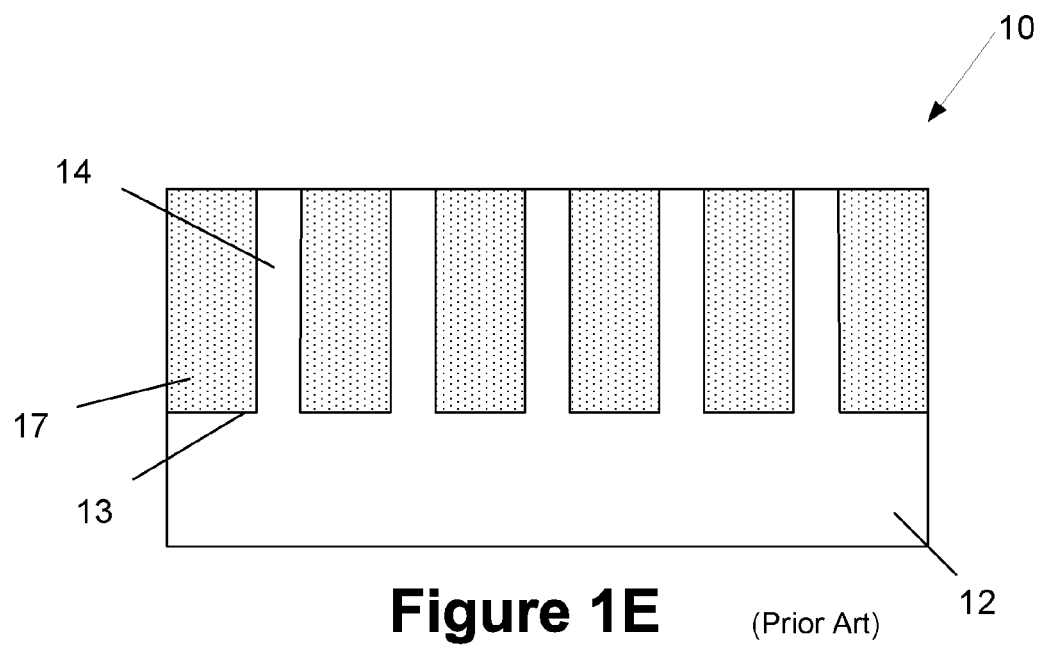
Figure 1F:
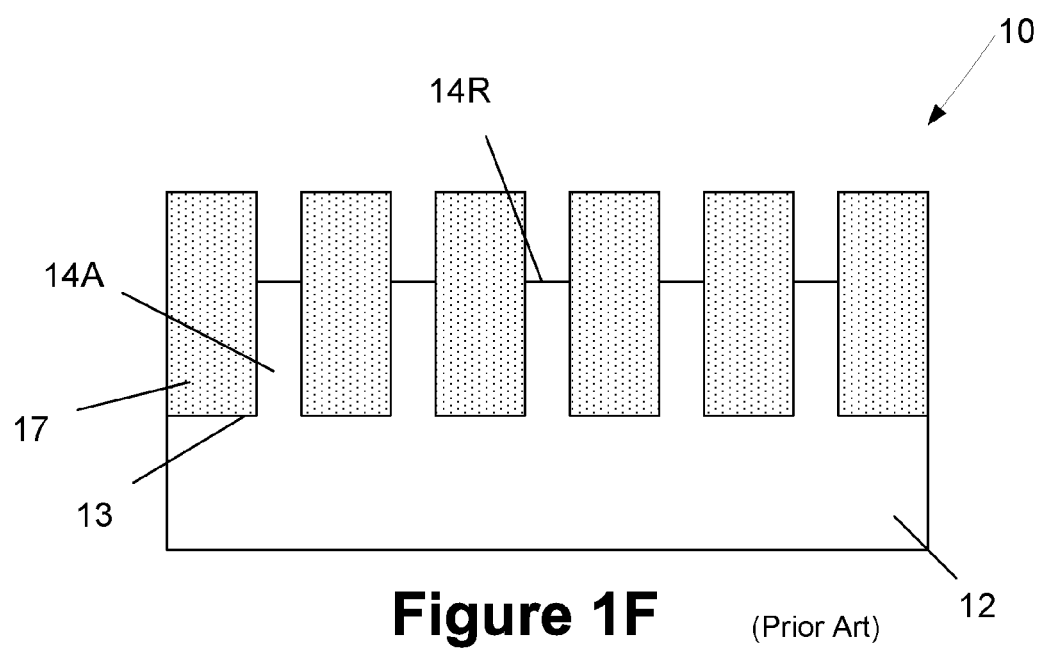
Figure 1G:
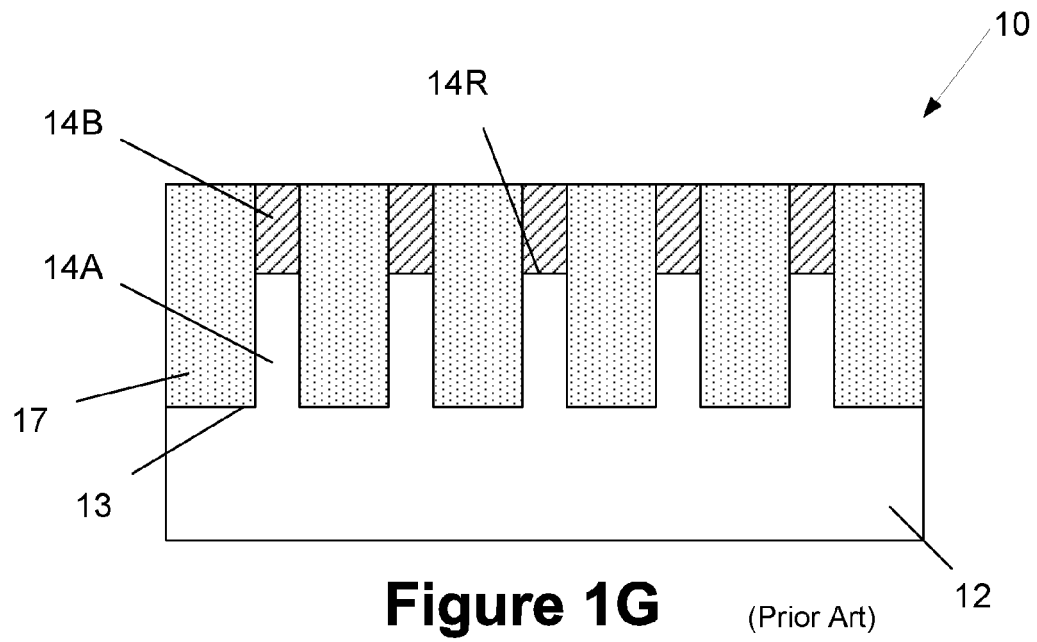
Figure 1H:
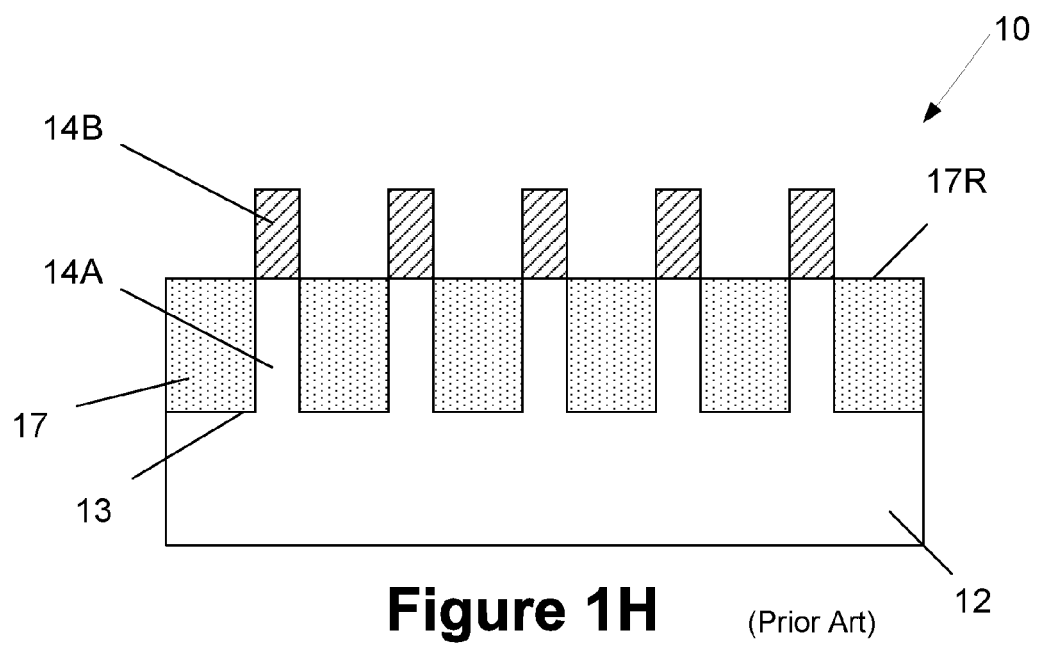

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming strained and relaxed germanium fins for PMOS and NMOS FinFET devices, respectively, in CMOS applications. The methods disclosed herein may be employed in manufacturing N-type devices and P-type devices, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
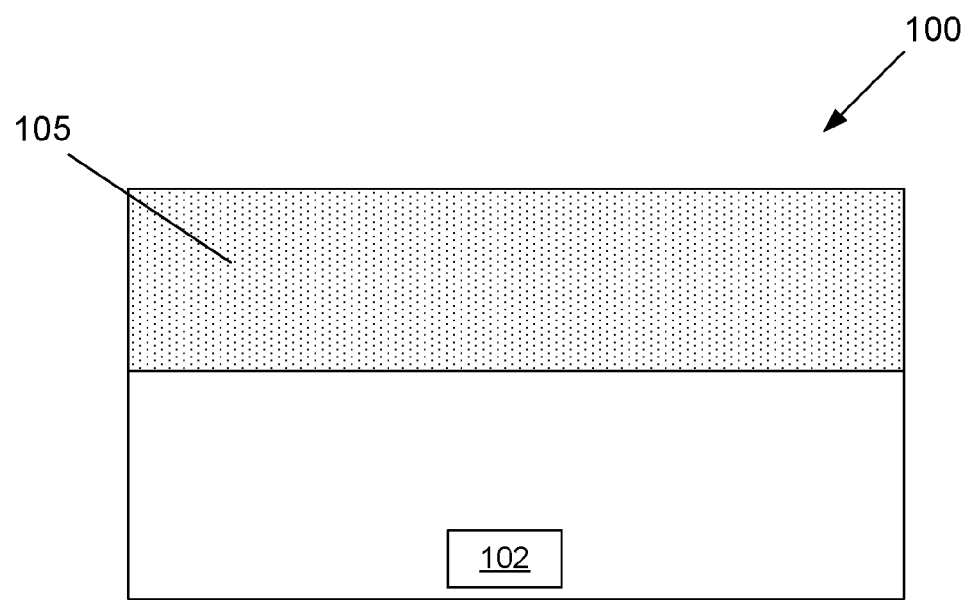
FIGS. 2A-2J depict various illustrative novel methods disclosed herein for forming strained and relaxed germanium fins for PMOS and NMOS FinFET devices, respectively.

FIGS. 2A-2J depict various illustrative novel methods of forming strained and relaxed germanium fins for PMOS and NMOS FinFET devices, respectively, on CMOS based integrated circuit products. With reference to FIG. 2A, the product 100 is depicted as being formed above a semiconductor substrate 102 comprised of a semiconductor material, such as, for example, a bulk silicon substrate. Thus, the terms "substrate," "semiconductor substrate" or "semiconducting substrate" should be understood to cover all semiconductor materials.

With continuing reference to FIG. 2A, a strain relaxed buffer (SRB) layer 105 was formed on the substrate 102. The SRB layer 105 may be formed to any desired thickness (or height) and it may be made of a variety of different materials. In one illustrative embodiment, the SRB layer 105 may be made of silicon germanium ($Si_{(1-x)}Ge_x$ where "x" ranges from 0-1), such as $Si_{0.75}Ge_{0.25}$ or $Si_{0.50}Ge_{0.5}$, it may be formed by performing an epitaxial growth process, and it may have a thickness that falls within the range of about 200-1000 nm. The SRB layer 105 may be formed such that it is in a partially or fully relaxed condition. The manner in which such SRB layers are formed so as to be in a partially or fully relaxed condition are well known to those skilled in the art.

Figure 2B:
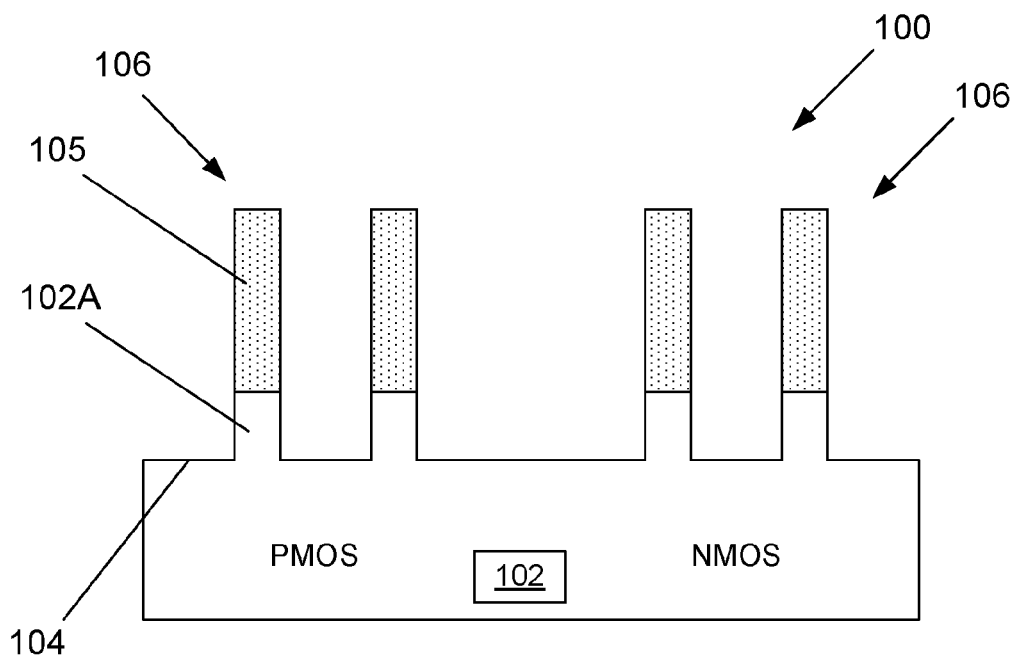

FIG. 2B depicts the product 100 after one or more etching processes, e.g., anisotropic etching processes, were performed through a patterned etch mask (not shown) to form a plurality of trenches 104 and thereby define a plurality of overall fin structures 106. As depicted, the fins 106 are comprised of the SRB material 105 and the substrate fin portion 102A. The width and height of the overall fin structures 106 may vary depending upon the particular application. Additionally, the overall size, shape and configuration of the trenches 104 and overall fin structures 106 may vary depending on the particular application and the thickness of the SRB layer 105.

In the illustrative examples depicted in the attached drawings, the trenches 104 and the fins 106 are all depicted as having a uniform size and shape. However, such uniformity in the size and shape of the trenches 104 and the fins 106 is not required to practice at least some aspects of the inventions disclosed herein. In the attached figures, the trenches 104 are depicted as having been formed by performing an anisotropic etching process that results in the overall fin structures 106 having a schematically (and simplistically) depicted, generally rectangular configuration. In an actual real-world device, the sidewalls of the fins 106 may be somewhat outwardly tapered, although that configuration is not depicted in the attached drawings. Thus, the size and configuration of the trenches 104 and the fins 106, and the manner in which they are made, should not be considered a limitation of the present invention. For ease of disclosure, only the substantially rectangular trenches 104 and fins 106 will be depicted in the subsequent drawings. Moreover, the product 100 may be formed with any desired number of fins 106. In the example depicted herein, the product 100 will be comprised of an NMOS device and a PMOS device, as depicted in FIG. 2B, each of which is comprised of two of the illustrative fins 106 at this point in the process flow.

Figure 2C:
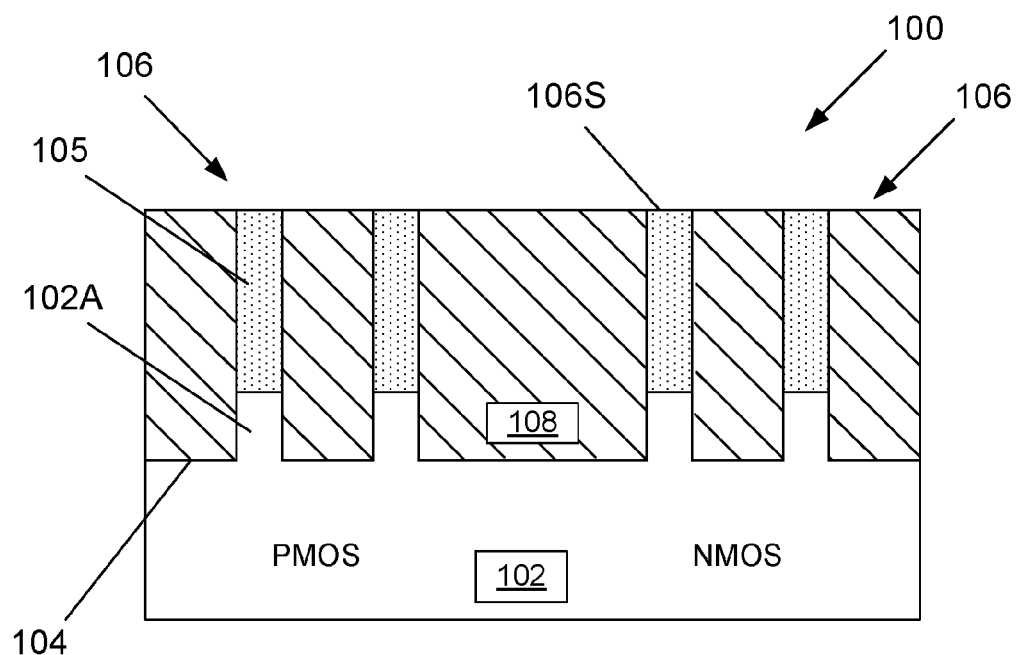

FIG. 2C depicts the product 100 after a layer of insulating material 108 (e.g., silicon dioxide) was deposited so as to overfill the trenches 104 and after at least one process operation, such as an optional chemical mechanical polishing (CMP) process, was performed to planarize the upper surface of the layer of insulating material 108 and thereby expose the upper surface 106S of the fins 106. In some embodiments, rather than remove the patterned mask layer (not shown) prior to the formation of the layer of insulating material 108, the layer of insulating material 108 may be deposited so as to overfill the trenches 104 and the patterned mask layer. Thereafter, one or more CMP processes may be performed to remove the patterned mask layer and portions of the layer of insulating material 108, stopping on the upper surface 106S of the fins 106.

Figure 2D:
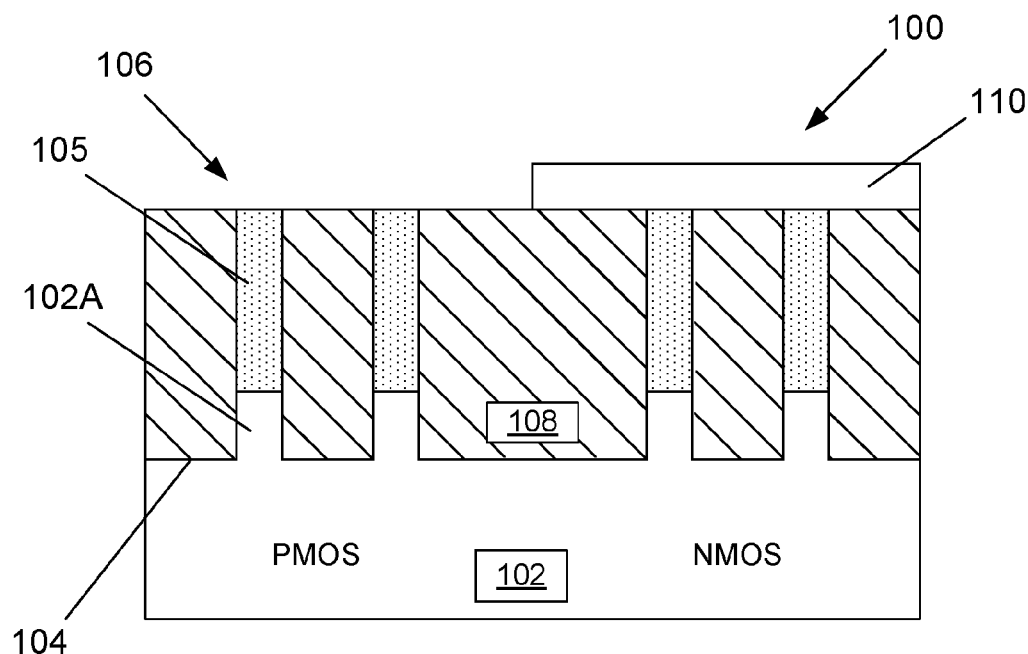

In the illustrative process flow depicted in the drawings, the PMOS device will be processed prior to processing the NMOS device. Of course, as will be appreciated by one skilled in the art after a complete reading of the present application, the processing order may be reversed if desired, i.e., the NMOS device may be processed prior to processing the PMOS device. Accordingly, FIG. 2D depicts the product 100 after a masking layer 110, such as a patterned hard mask, was formed so as to cover the NMOS region and expose the PMOS region for further processing.

Figure 2E:
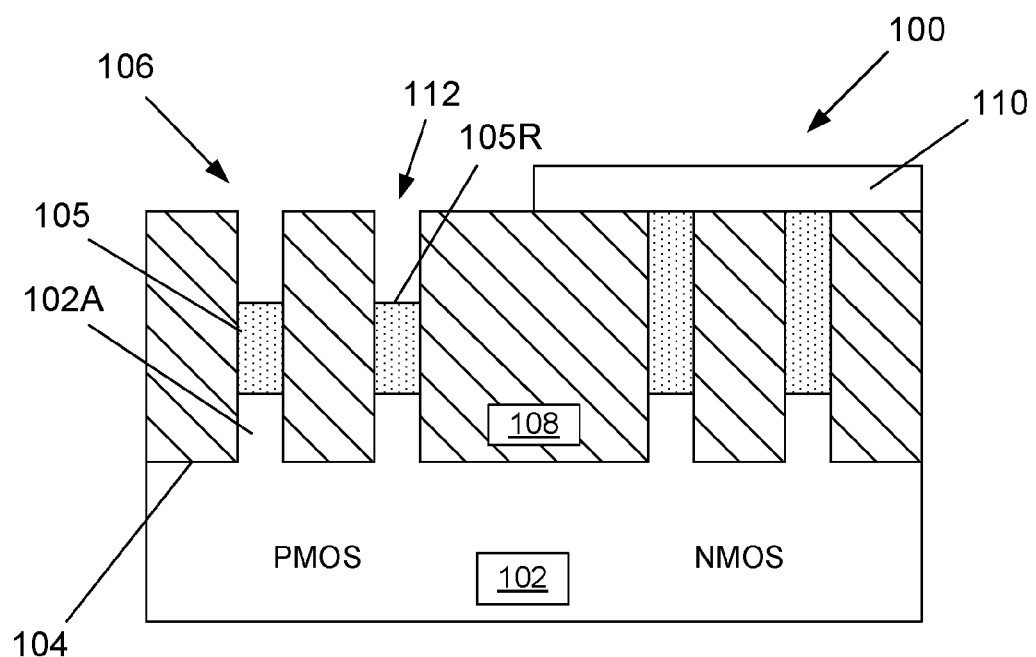

FIG. 2E depicts the product 100 after a timed recess etching process was performed through the masking layer 110 to remove a portion of SRB material 105 of the fins 106 for the PMOS device to thereby define a plurality of PMOS replacement fin cavities 112 above the fins 106 for the PMOS device. The recessed upper surface 105R of the SRB material 105 is exposed at the bottom of the PMOS fin cavities 112. The depth of the PMOS fin cavities 112 may vary depending upon the particular application. In general, the depth of the PMOS fin cavities 112 should be shallow enough such that a fully-strained, substantially defect-free substantially pure germanium material 114 (described below) may be formed in the PMOS fin cavities 112, e.g., about 30-50 nm. As will be understood by those skilled in the art after a complete reading of the present application, the fully-strained, substantially defect-free substantially pure germanium material 114 will serve as the channel semiconductor material for the PMOS device.

Figure 2F:
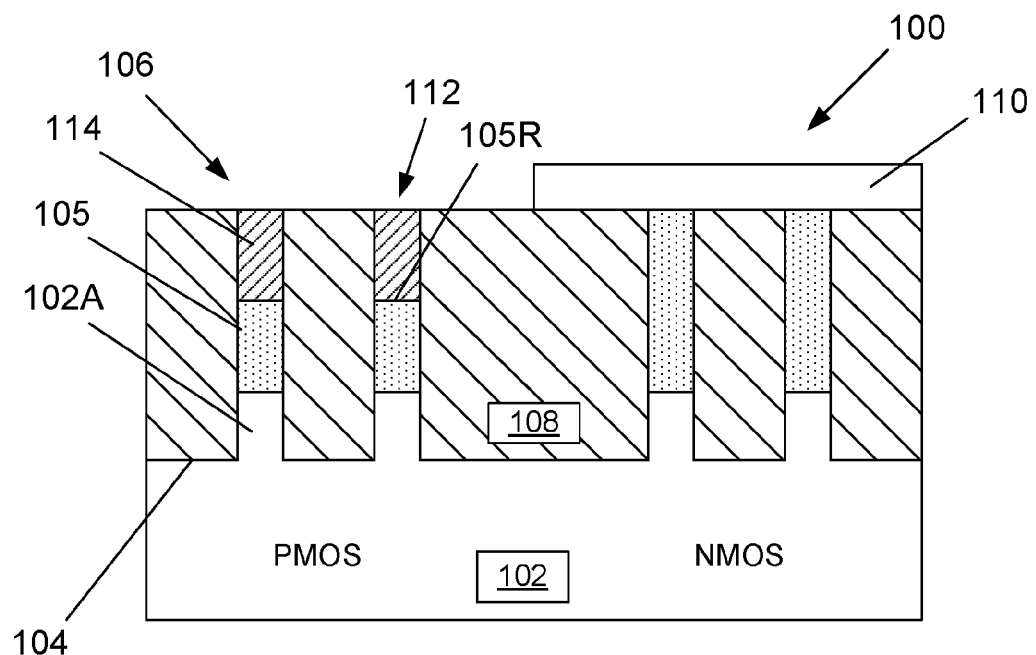

FIG. 2F depicts the product 100 after a channel semiconductor material 114 was formed on the recessed upper surface 105R of the strain relaxed buffer (SRB) material 105 in the PMOS fin cavities 112 by performing an epitaxial deposition process. As noted above, the channel semiconductor material 114 may be a fully-strained, substantially defect-free substantially pure germanium material. In one embodiment, the growth of the channel semiconductor material 114 may be controlled such that it remains entirely within the PMOS replacement fin cavities 112. In other embodiments, the channel semiconductor material 114 may be formed such that it overfills the replacement PMOS fin cavities 112. In such a situation, a CMP process may be performed to remove excess amounts of the channel semiconductor material 114 positioned outside of the replacement PMOS fin cavities 112. If desired, the channel semiconductor material 114 may be formed with a compressive stress to enhance the performance of the PMOS device.

Figure 2G:
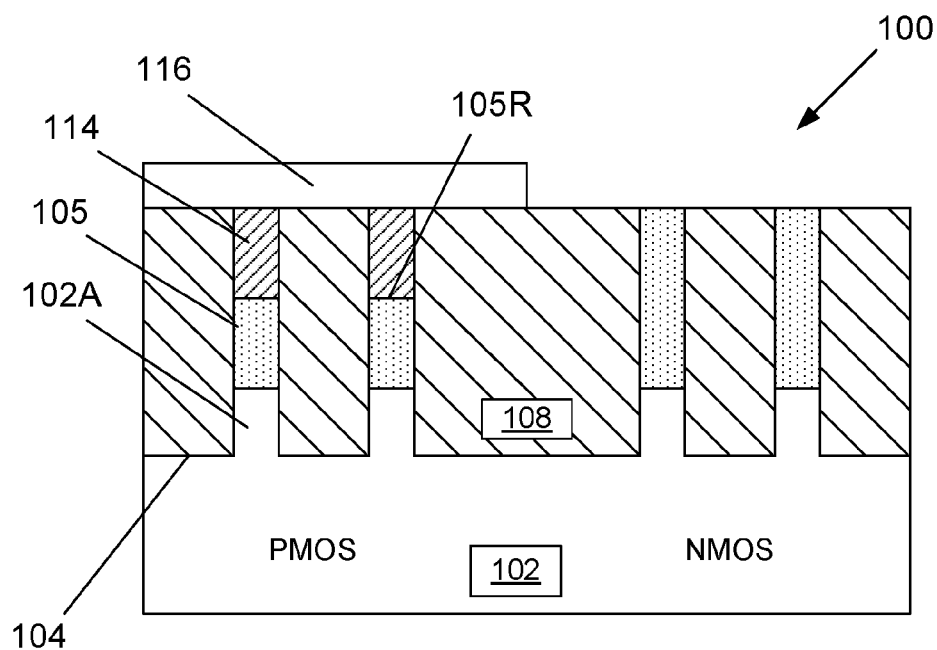

FIG. 2G depicts the product 100 after several process operations were performed. First, the masking layer 110 was removed. Next, a masking layer 116, such as a patterned hard mask layer, was formed so as to cover the PMOS region and expose the NMOS region for further processing.

Figure 2H:
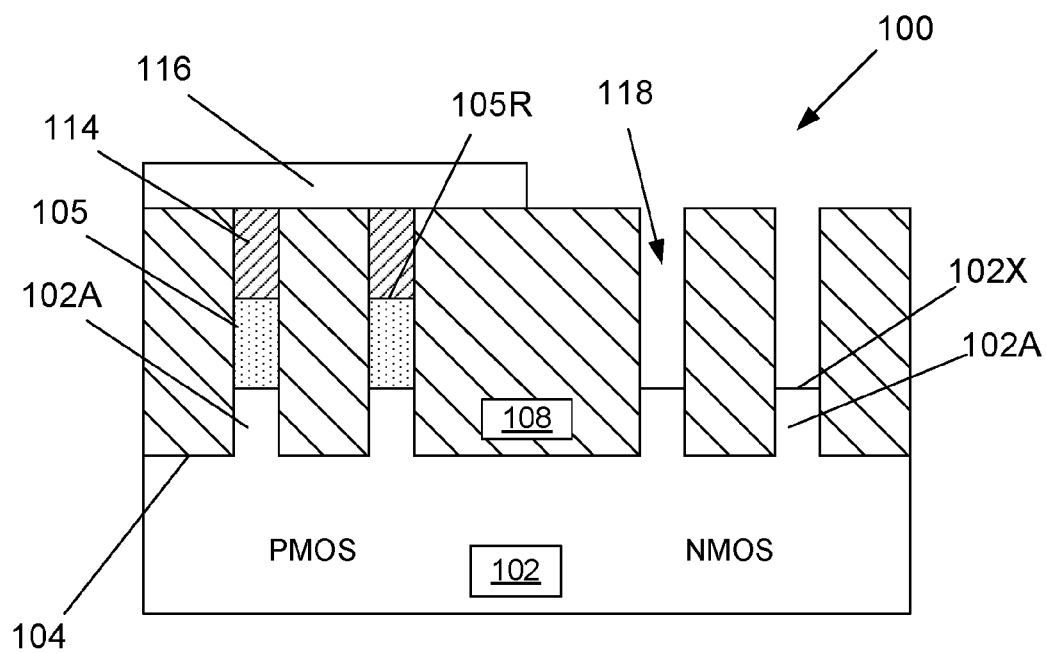

FIG. 2H depicts the product 100 after a recess etching process was performed through the masking layer 116 to remove all of the SRB material 105 of the fins 106 for the NMOS device to thereby define a plurality of NMOS replacement fin cavities 118 above the substrate fin portion 102A of the fins 106 for the NMOS device. The upper surface 102X of the substrate fin portion 102A is exposed at the bottom of the NMOS fin cavities 118. The depth of the NMOS fin cavities 118 may vary depending upon the particular application, e.g., about 100-200 nm. In general, the depth of the NMOS fin cavities 118 should be deep enough such that a fully-relaxed substantially pure germanium material 120 (described below) may be formed in at least the upper regions of the NMOS fin cavities 118 using aspect-ratio-trapping (ART) techniques. As will be understood by those skilled in the art after a complete reading of the present application, the fully-relaxed substantially pure germanium material 120 in the upper portion of the NMOS fin cavities 118 will serve as the channel semiconductor material for the NMOS device.

Figure 2I:
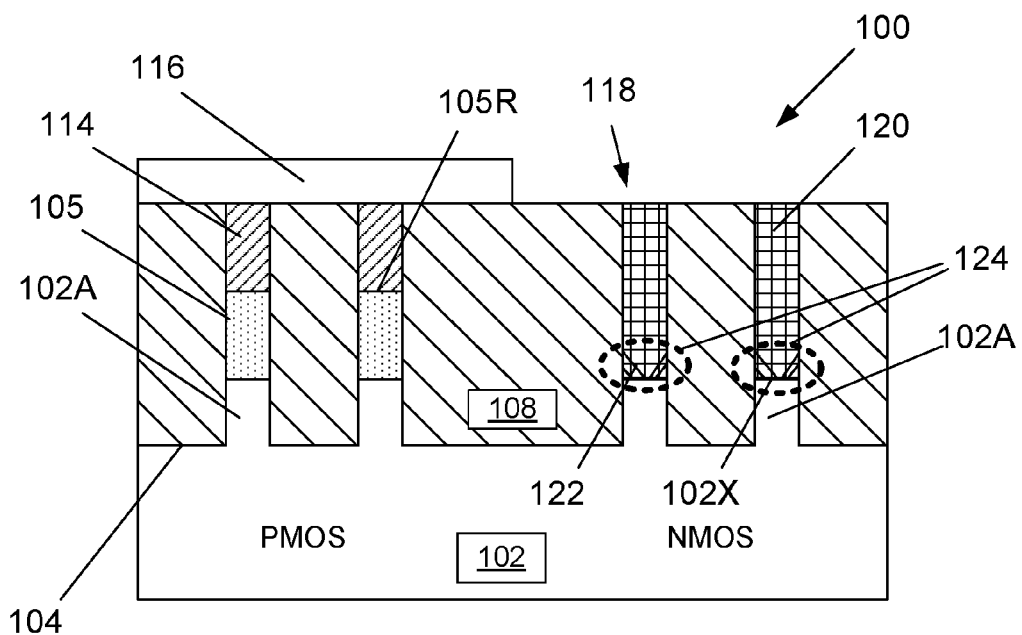

FIG. 2I depicts the product 100 after a channel semiconductor material 120 was formed on the upper surface 102X of the substrate fins 102A in the replacement NMOS fin cavities 118 by performing an epitaxial deposition process and using aspect-ratio-trapping (ART) techniques. As shown in FIG. 2I, the ART process involves intentionally creating simplistically depicted defects 122 (in the dashed line regions 124) at or near the interface between the germanium material 120 and the substrate fin 102A. These defects 122 are trapped at or near the bottom of the NMOS fin cavities 118. As a result, the upper portions of the channel semiconductor material 120 may be a fully-relaxed substantially pure germanium material that is substantially defect free. In one embodiment, the growth of the channel semiconductor material 120 may be controlled such that it remains entirely within the NMOS fin cavities 118. In other embodiments, the channel semiconductor material 120 may be formed such that it overfills the NMOS fin cavities 118. In such a situation, a CMP process may be performed to remove excess amounts of the channel semiconductor material 120 positioned outside of the NMOS fin cavities 118.

Figure 2J:
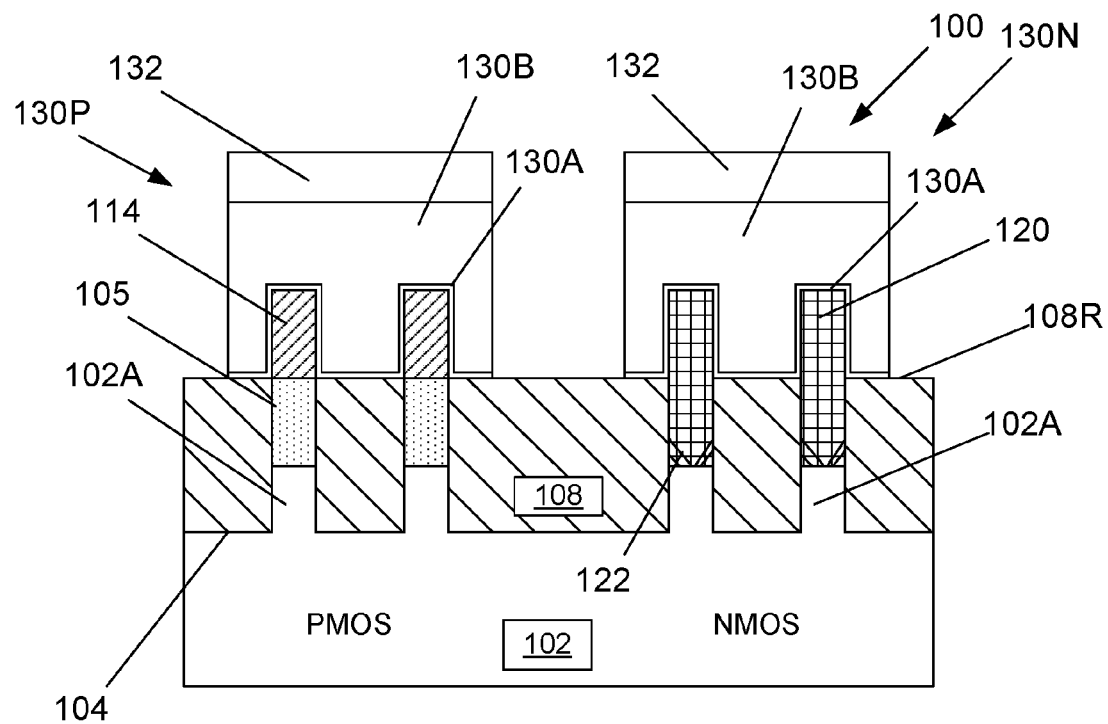

At the point of processing depicted in FIG. 2I, the masking layer 116 may be removed and the illustrative FinFET based CMOS product 100 may be completed using traditional fabrication techniques. For example, FIG. 2J depicts the product 100 after the layer of insulating material 108 was recessed so as to expose all or a portion of the channel semiconductor material 114 and the channel semiconductor material 120 above the recessed upper surface 108R. Thereafter, illustrative and representative gate structures 130N, 130P and gate cap layers 132 were formed for the NMOS and PMOS devices. Of course, the materials of construction for the gate structures of the NMOS and PMOS devices may and likely will be different. In one illustrative embodiment, the schematically depicted gate structures 130N, 130P include an illustrative gate insulation layer 130A and an illustrative gate electrode 130B. The gate insulation layer 130A may be comprised of a variety of different materials, such as, for example, silicon dioxide, a so-called high-k (k greater than 10) insulation material (where k is the relative dielectric constant), etc. Similarly, the gate electrode 130B may also be of a material such as polysilicon or amorphous silicon, or it may be comprised of one or more metal layers that act as the gate electrode 130B. As will be recognized by those skilled in the art after a complete reading of the present application, the gate structures 130N, 130P of the product 100 depicted in the drawings, i.e., the gate insulation layer 130A and the gate electrode 130B, are intended to be representative in nature. That is, the gate structures 130N, 130P may be comprised of a variety of different materials and they may have a variety of configurations. The gate structures 130N, 130P may be made using either the so-called "gate-first" or "replacement gate" techniques.

Figure 3A:
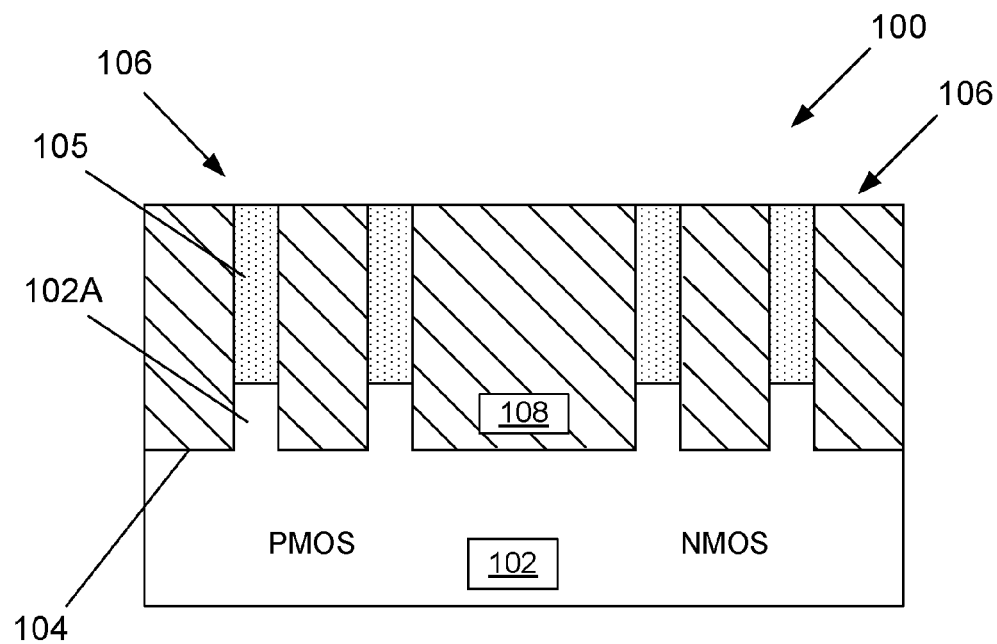
FIGS. 3A-3F depict yet other illustrative novel methods disclosed herein for forming strained and relaxed germanium fins for PMOS and NMOS FinFET devices, respectively.

FIGS. 3A-3F depict yet other illustrative novel methods disclosed herein for forming strained and relaxed germanium fins for PMOS and NMOS FinFET devices, respectively, on CMOS based integrated circuit products 100. FIG. 3A depicts the product 100 at a point in fabrication that corresponds to that shown in FIG. 2C. Relative to the embodiment shown in FIGS. 2A-2J, in the embodiment disclosed in FIGS. 3A-3F, a single epitaxial deposition process may be performed to form both the above-described channel semiconductor material 114 for the PMOS device (a fully-strained, substantially defect-free substantially pure germanium material) and the above-described channel semiconductor material 120 for the NMOS device (a fully-relaxed substantially pure germanium material that is substantially defect free).

Figure 3B:
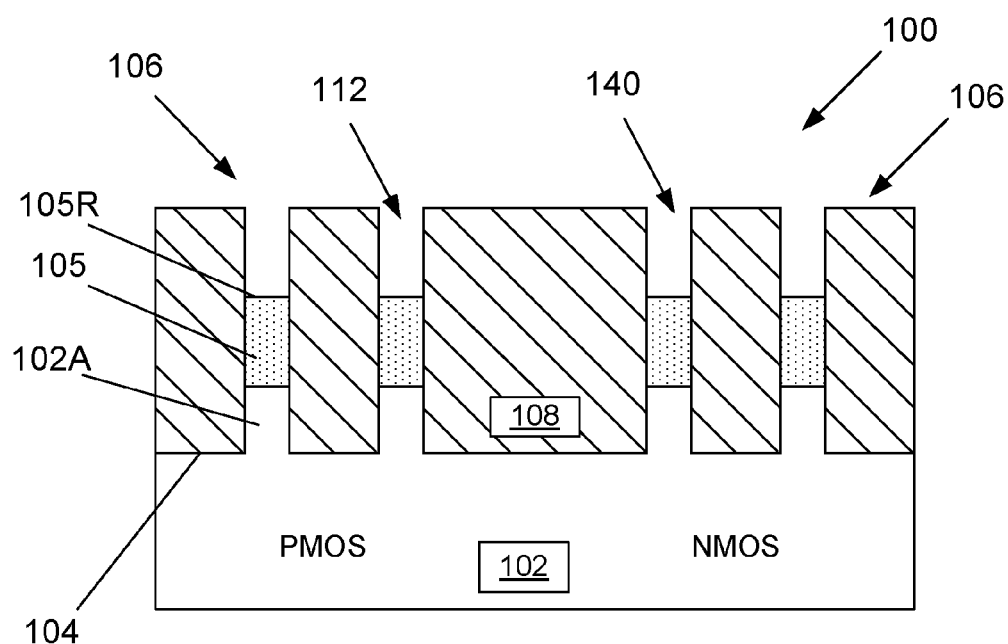

FIG. 3B depicts the product 100 after a timed recess etching process was performed on the fins for both the PMOS and NMOS devices to remove a portion of SRB material 105 of the fins 106 for both the PMOS device and the NMOS device. This process operation results in the definition of a plurality of PMOS fin cavities 112 above the fins 106 for the PMOS device and a plurality of initial, partial-depth cavities 140 for the NMOS device. The recessed upper surface 105R of the SRB material 105 is exposed at the bottom of the PMOS fin cavities 112 and the initial cavities 140 for the NMOS device. As noted above, the depth of the PMOS fin cavities 112 may vary depending upon the particular application. In general, the depth of the PMOS fin cavities 112 should be shallow enough such that the above-described fully-strained, substantially defect-free substantially pure germanium channel semiconductor material 114 may be formed in the PMOS fin cavities 112.

Figure 3C:
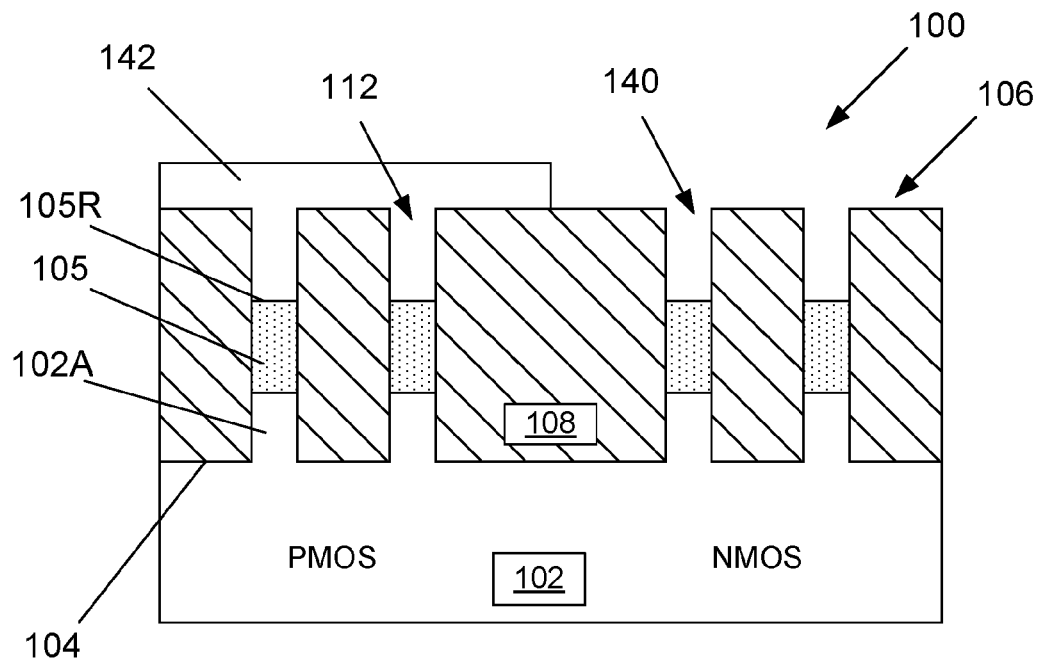

FIG. 3C depicts the product 100 after a patterned masking layer 142, such as a patterned hard mask layer, was formed so as to cover the PMOS region and expose the NMOS region for further processing. Note that the masking layer 142 may fill the PMOS fin cavities 112.

Figure 3D:
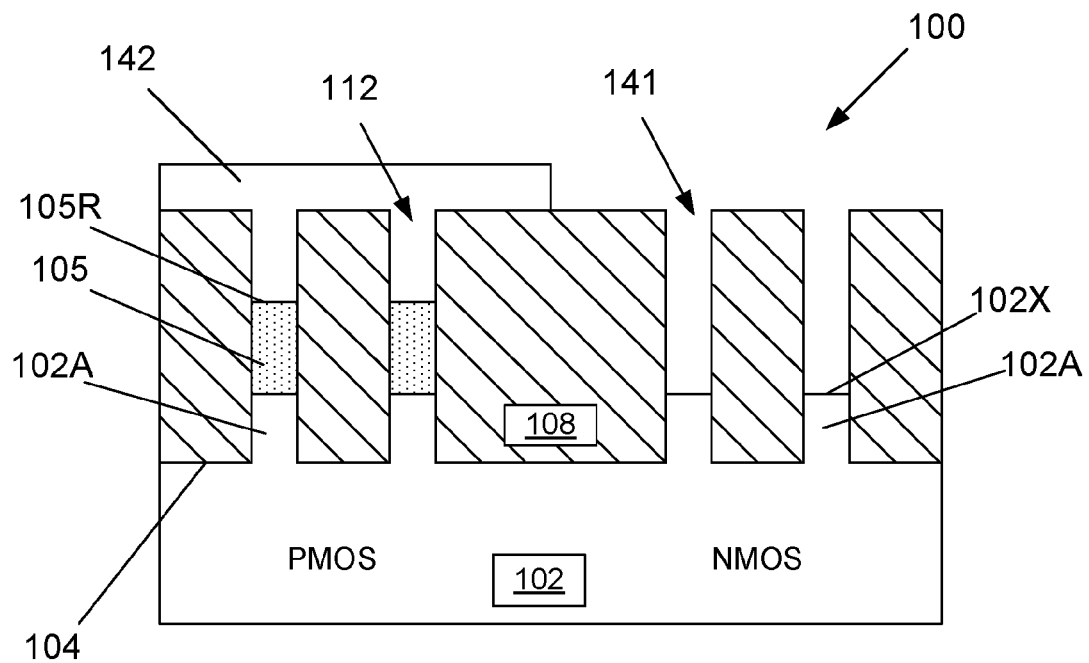

FIG. 3D depicts the product 100 after a recess etching process was performed through the masking layer 142 to remove all of the SRB material 105 of the fins 106 for the NMOS device to thereby define a plurality of final NMOS fin cavities 141 above the substrate fin portion 102A of the fins 106 for the NMOS device. The upper surface 102X of the substrate fin portion 102A is exposed at the bottom of the final NMOS fin cavities 141. The depth of the final NMOS fin cavities 141 may vary depending upon the particular application and may generally correspond to the depth of the above-described NMOS cavities 118. As noted above, the depth of the final NMOS fin cavities 141 should be deep enough such that the above-described fully-relaxed substantially pure germanium channel semiconductor material 120 may be formed in at least the upper regions of the final NMOS fin cavities 141 using aspect-ratio-trapping (ART) techniques.

Figure 3E:
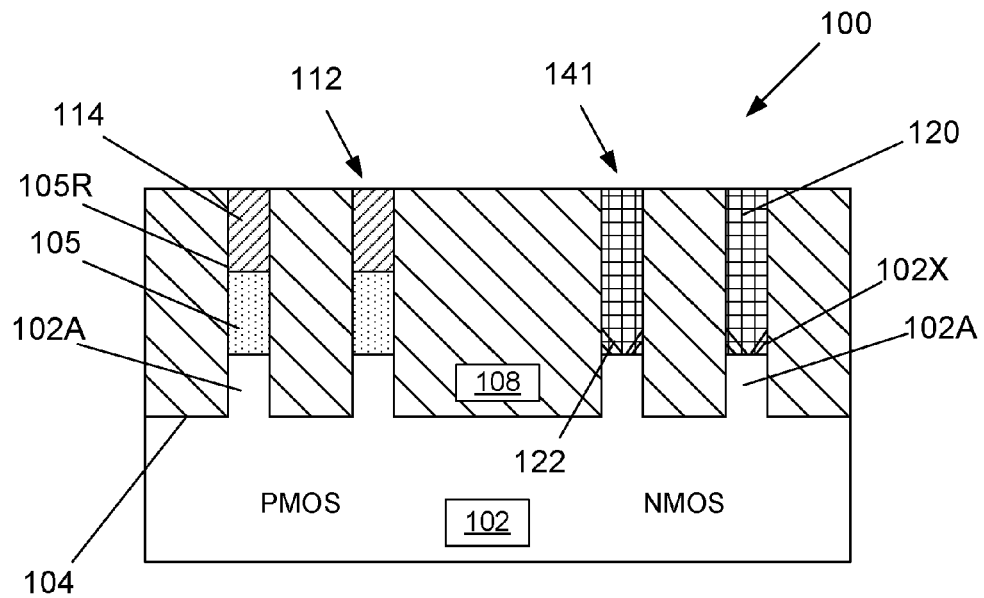

FIG. 3E depicts the product 100 after several process operations were performed. First, the masking layer 142 was removed. Next, a common epitaxial deposition process was performed to form both the above-described channel semiconductor material 114 in the PMOS fin cavities 112 and the above-described channel semiconductor material 120 in the final NMOS fin cavities 141. Note that the channel semiconductor material 114 was formed on the recessed upper surface 105R of the strain relaxed buffer (SRB) material 105 in the PMOS fin cavities 112, while the channel semiconductor material 120 was formed on the upper surface 102X of the substrate fins 102A in the final NMOS fin cavities 141 using aspect-ratio-trapping (ART) techniques. Thereafter, a CMP process was performed to remove excess portions of the channel semiconductor material 114 and the channel semiconductor material 120 positioned outside of the cavities 112, 141 above the layer of insulating material 108.

Figure 3F:
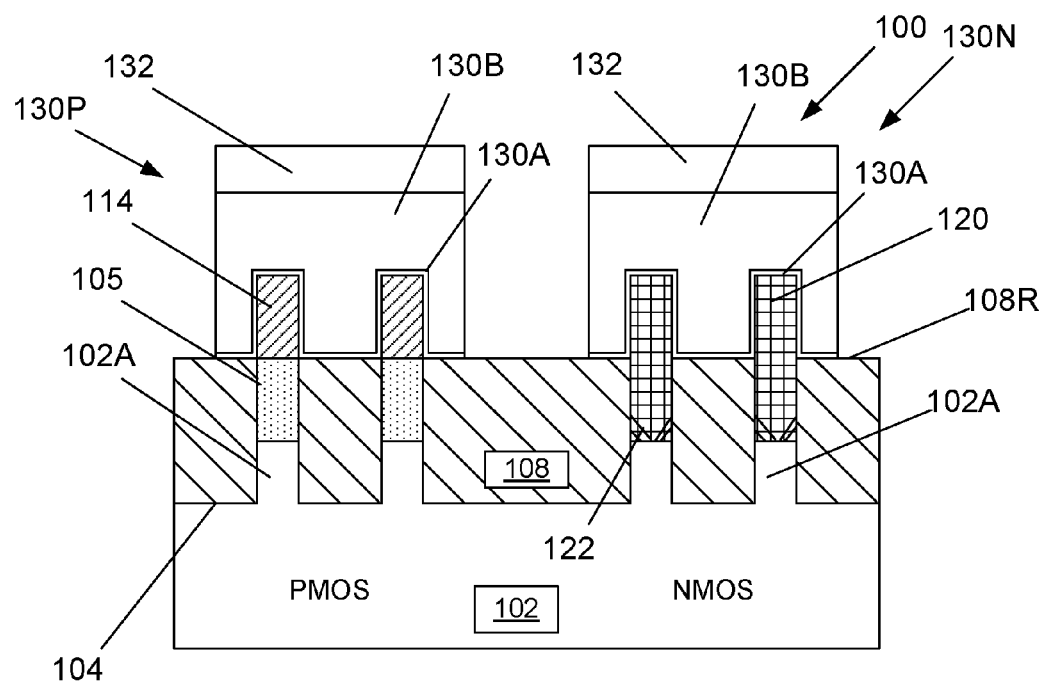

At the point of processing depicted in FIG. 3E, the illustrative FinFET based CMOS product 100 may be completed using traditional fabrication techniques. For example, FIG. 3F depicts the product 100 after the layer of insulating material 108 was recessed so as to expose all or a portion of the channel semiconductor material 114 and the channel semiconductor material 120 above the recessed upper surface 108R. Thereafter, the above-described illustrative and representative gate structures 130N, 130P and gate cap layers 132 were formed for the NMOS and PMOS devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming PMOS and NMOS FinFET devices for a CMOS integrated circuit product formed on a semiconductor substrate made of a first semiconductor material, the method comprising:

forming a first fin for said PMOS device and a second fin for said NMOS device, each of said first and second fins comprising a lower substrate fin portion made of said first semiconductor material and an upper fin portion that is positioned above said lower substrate fin portion, wherein said upper fin portion is made of a second semiconductor material that is different from said first semiconductor material;

forming a layer of insulating material adjacent said first and second fins;

performing at least one process operation to:

form a first channel semiconductor material for said PMOS FinFET device that comprises a fully-strained, substantially defect-free substantially pure germanium material on a recessed upper surface of said upper fin portion of said first fin; and form a second channel semiconductor material for said NMOS FinFET device that comprises a fully-relaxed substantially pure germanium material that is substantially defect free positioned above an upper surface of said lower substrate fin portion of said second fin;

performing at least one recess etching process on said layer of insulating material to expose at least a portion of said first and second channel semiconductor materials;

forming a gate structure for said PMOS FinFET device around said exposed portion of said first channel semiconductor material; and forming a gate structure for said NMOS FinFET device around said exposed portion of said second channel semiconductor material.

2. The method of claim 1, wherein said first semiconductor material is silicon.

3. The method of claim 2, wherein said second semiconductor material comprises silicon germanium.

4. The method of claim 1, wherein performing said at least one process operation comprises forming a defect-containing region of said substantially pure germanium that is positioned vertically between said second channel semiconductor material and said upper surface of said lower substrate fin portion of said second fin.

5. The method of claim 4, wherein said first channel semiconductor material is formed prior to the formation of said second channel semiconductor material.

6. The method of claim 4, wherein said second channel semiconductor material is formed prior to the formation of said first channel semiconductor material.

7. The method of claim 1, wherein performing said at least one process operation comprises performing separate first and second epitaxial deposition processes to form said first and second channel semiconductor materials, respectively.

8. The method of claim 1, wherein performing said at least one process operation comprises performing a single epitaxial deposition process to form both said first and second channel semiconductor materials at the same time.

9. The method of claim 1, wherein performing said at least one process operation comprises:

forming a first patterned masking layer that covers said second fin and exposes said first fin;

performing a first recess etching process through said first patterned masking layer on said upper portion of said first fin so as to remove a portion, but not all, of said upper portion of said first fin such that said upper portion of said first fin has a recessed upper surface that is positioned at level that is below a level of an upper surface of said layer of insulating material, and with said first patterned masking layer in position, performing a first epitaxial deposition process to form said first channel semiconductor material on said recessed upper surface of said upper portion of said first fin.

10. The method of claim 9, wherein performing said at least one process operation comprises:

removing said first patterned masking layer;

forming a second patterned masking layer that covers said first channel semiconductor material and exposes said second fin;

performing a second recess etching process through said second patterned masking layer on said upper portion of said second fin so as to remove all of said upper portion of said second fin so as to expose an upper surface of said lower substrate fin portion of said second fin; and with said second patterned masking layer in position, performing a second epitaxial deposition process to form said second channel semiconductor material above said upper surface of said lower substrate fin portion of said second fin.

11. The method of claim 1, wherein performing said at least one process operation comprises:

forming a first patterned masking layer that covers said first fin and exposes said second fin;

performing a first recess etching process through said first patterned masking layer on said upper portion of said second fin so as to remove all of said upper portion of said second fin so as to expose an upper surface of said lower substrate fin portion of said second fin; and with said first patterned masking layer in position, performing a first epitaxial deposition process to form said second channel semiconductor material above said upper surface of said lower substrate fin portion of said second fin.

12. The method of claim 11, wherein performing said at least one process operation comprises:

removing said first patterned masking layer;

forming a second patterned masking layer that covers said second channel semiconductor material and exposes said first fin;

performing a second recess etching process through said second patterned masking layer on said upper portion of said first fin so as to remove a portion, but not all, of said upper portion of said first fin such that said upper portion of said first fin has a recessed upper surface that is positioned at level that is below a level of an upper surface of said layer of insulating material; and with said second patterned masking layer in position, performing a second epitaxial deposition process to form said first channel semiconductor material on said recessed upper surface of said upper portion of said first fin.

13. The method of claim 1, wherein performing said at least one process operation comprises:

performing a first common recess etching process on said upper portions of both said first and second fins so as to remove a portion, but not all, of said upper portions of both said first and second fins such that said upper portions of both said first and second fins have a recessed upper surface that is positioned at level that is below a level of an upper surface of said layer of insulating material;

forming a first patterned masking layer that covers said first fin and exposes said recessed upper surface of said upper portion of said second fin;

with said first patterned masking layer in position, performing a second recess etching process through said first patterned masking layer on said upper portion of said second fin so as to remove all of said upper portion of said second fin and thereby expose an upper surface of said lower substrate fin portion of said second fin;

removing said first patterned mask layer; and performing a single epitaxial deposition process to form said first channel semiconductor material on said recessed upper surface of said upper portion of said first fin and to form said second channel semiconductor material above said upper surface of said lower substrate fin portion of said second fin.

14. A method of forming PMOS and NMOS FinFET devices for a CMOS integrated circuit product formed on a semiconductor substrate comprising silicon, the method comprising:
  forming a first fin for said PMOS device and a second fin for said NMOS device, each of said first and second fins comprising a lower substrate fin portion made of silicon and an upper fin portion that is positioned above said lower substrate fin portion, wherein said upper fin portion comprises silicon-germanium;
  forming a layer of insulating material adjacent said first and second fins, said layer of insulating material having an upper surface;
  performing at least one process operation to:
    remove a portion, but not all, of said upper fin portion of said first fin such that said upper fin portion of said first fin has a recessed upper surface that is positioned at level that is below a level of said upper surface of said layer of insulating material;
    remove all of said upper fin portion of said second fin so as to expose an upper surface of said lower substrate fin portion of said second fin;
    form a first channel semiconductor material for said PMOS FinFET device that comprises a fully-strained, substantially defect-free substantially pure germanium material on said recessed upper surface of said upper fin portion of said first fin; and
    form a second channel semiconductor material for said NMOS FinFET device that comprises a fully-relaxed substantially pure germanium material that is substantially defect free positioned above said upper surface of said lower substrate fin portion of said second fin;
  performing at least one recess etching process on said layer of insulating material to expose at least a portion of said first and second channel semiconductor materials;
  forming a gate structure for said PMOS FinFET device around said exposed portion of said first channel semiconductor material; and
  forming a gate structure for said NMOS FinFET device around said exposed portion of said second channel semiconductor material.

15. The method of claim 14, wherein performing said at least one process operation comprises forming a defect-containing region of said substantially pure germanium that is positioned vertically between said second channel semiconductor material and said upper surface of said lower substrate fin portion of said second fin.

16. The method of claim 14, wherein performing said at least one process operation comprises performing separate first and second epitaxial deposition processes to form said first and second channel semiconductor materials, respectively.

17. The method of claim 16, wherein said first channel semiconductor material is formed prior to the formation of said second channel semiconductor material.

18. The method of claim 16, wherein said second channel semiconductor material is formed prior to the formation of said first channel semiconductor material.

19. The method of claim 14, wherein performing said at least one process operation comprises performing a single epitaxial deposition process to form both said first and second channel semiconductor materials at the same time.

* * * * *